United States Patent [19]

White et al.

[11] 3,769,561

[45] Oct. 30, 1973

[54] CURRENT LIMITING INTEGRATED CIRCUIT

[75] Inventors: Joseph P. White, South Somerville; Robert Amantea, Princeton; Hans W. Becke, Morristown, all of N.J.

[73] Assignee: The United States of America as represented by the Secretary of the Navy, Washington, D.C.

[22] Filed: Feb. 24, 1972

[21] Appl. No.: 229,139

[52] U.S. Cl. ..... 317/235 R, 317/235 A, 317/235 F, 317/235 G, 317/235 Z

[51] Int. Cl. ..... H01l 11/06, H01l 11/14, H01l 19/00

[58] Field of Search ..................... 317/235 A, 235 Z

[56] References Cited

UNITED STATES PATENTS 3,519,898 7/1970 Nakatani ......................... 317/235 Z 3,488,835 1/1970 Becke et al. .................... 317/235 Z

*Primary Examiner*—John W. Huckert
*Assistant Examiner*—William D. Larkins
*Attorney*—R. S. Sciascia et al.

[57] ABSTRACT

An integrated circuit having a laminated bipolar transistor with multi-emitters respectively serially connected to a plurality of deep depletion field effect transistors and/or inversion channel field effect transistors. The integrated circuit has a common layer functioning as both the drain of one of the field effect transistors and an emitter of the bipolar transistor. In operation the field effect transistors conduct currents in series with the respective emitters of the bipolar transistor. In addition the field effect transistors provide ballasting by limiting the current therethrough.

4 Claims, 8 Drawing Figures

CURRENT LIMITING INTEGRATED CIRCUIT

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention generally relates to high power transistor circuits and more particularly to integrated circuits functioning as high power transistors with current ballasting.

Power transistors having selected electrodes connected in parallel are often utilized to provide large currents in high power applications. A problem with such devices is the balancing of the current through each of the parallelly connected electrodes. If one of the transistors is not properly matched, excessive current may flow through this transistor causing heating problems. Some known devices utilize the connecting of alloy wire or thin film resistors in series with each transistor emitter to provide control by limiting the current through the transistor. This method is not always highly satisfactory, however, as the resistor itself whether constant or having a positive temperature coefficient tends to heat creating additional heating problems. A further problem is that in order to provide a satisfactory reduction in the current through each transistor, it is often necessary to design the circuit so that a reduction in current starts to take place far short of the optimum control point.

SUMMARY OF THE INVENTION

Accordingly, it is a general purpose and object of the present invention to provide an improved semiconductor current limiting circuit. It is a further object to provide an integrated circuit that performs as a transistor below a predetermined current level and provides current limiting features upon reaching this level. It is an additional object of the present invention to provide an integrated circuit with a multiplicity of current paths for use as a high power amplifier in frequencies up to 200 mHz in which the currents are properly balanced.

This is accomplished according to the present invention by providing ballasting to a multi-emitter bipolar transistor in an integrated circuit. The circuit operates as a plurality of field effect transistors having source and drain electrodes respectively serially connected to the emitters of the bipolar transistor. Each field effect transistor functions independently within the integrated circuit so as to limit the current therethrough upon the current reaching a predetermined value. This limiting is caused by a pinching action that restricts any additional flow above a predetermined value. As a result the current through each emitter electrode is limited and heating problems due to excessive current flow is avoided.

DESCRIPTION OF THE PREFERRED EMBODIMENT

Figure 1:
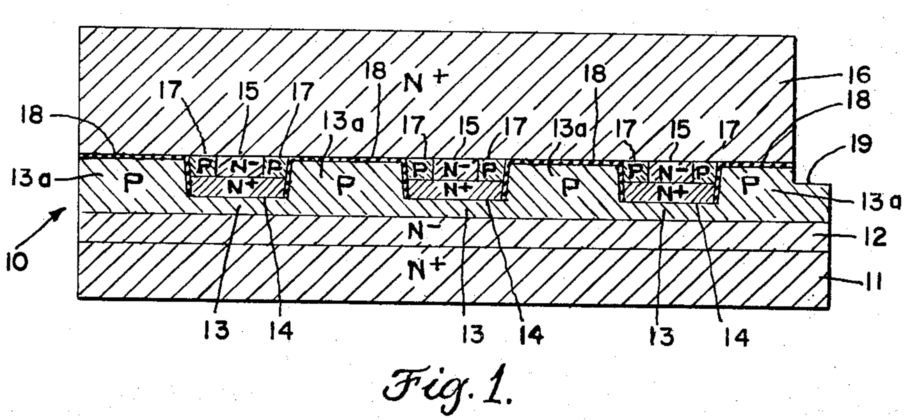
FIG. 1 is a cross-sectional view of an embodiment of the present invention.

Referring now to FIG. 1 there is shown a laminated integrated circuit 10 having a substrate 11 that is a monocrystalline body of $N^+$ type conductivity. Adjacent to layer 11 is an $N^-$ type conductivity layer 12 that functions as a collector in a multiemitter bipolar transistor which includes elements 11, 12, 13, 13*a* and 14 of integrated circuit 10. On top of and adjacent to collector layer 12 is the P type layer 13 that functions as the base of the bipolar transistor. Semiconductor component 13*a* is an extension of the base layer 13. Component 13a is given separate identity to base 13 for use in the explanation below of the construction of the circuit 10. A plurality of $N^+$ type layers 14 abut layer 13 and function as both multi-emitters in the bipolar transistor and as a drain in a plurality of field effect transistors. The FET's include elements 14, 15, 16 and 17 of integrated circuit 10. Three such FET's are shown. It is to be understood, however, that many more could be included in the circuit 10. An $N^-$ type layer 15 forms a channel in each of the FET's with surrounding P type conductivity 17 functioning as the gate electrode. Adjacent the layer of elements 15 and 17 is an $N^+$ type layer 16 functioning as the source electrode of the FET. Surrounding elements 14 and 17 and providing spacing between elements 13*a* and 16 is an oxide insulation layer 18 for providing the required insulation between the components functioning as the field effect transistors and the base of the multi-emitter bipolar transistor. A shoulder 19 is provided for ease in providing a contact (not shown) and a bias voltage to the base 13, 13*a* of the bipolar portion of circuit 10.

Figure 2:
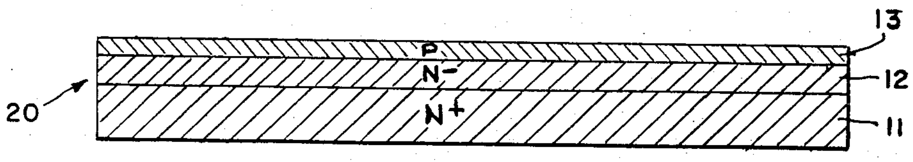
FIGS. 2–5, inclusive, are cross-sectional diagrams of selected portions of FIG. 1 for explaining the manufacture of the embodiment.

The manufacture of integrated circuit 10 can be more easily explained by referring to FIGS. 2–5, inclusive. In FIG. 2 there is shown a first wafer 20 that has the layer 11 forming a substrate of $N^+$ type conductivity that may be silicon heavily doped with antimony. Substrate 11 has a thickness of about 7 mils. On top of substrate 11 the layer 12 which may comprise silicon doped with antimony is epitaxially grown to form an $N^-$ type layer that varies depending on voltage specifications and may be approximately 3 mils thick in a 1,000 $V_{cb}$ transistor. Layer 12 is a monocrystalline extension of substrate layer 11. Another layer 13 of silicon doped with boron is then epitaxially grown on layer 12 to form the P type layer 13 having a thickness of about 5 mils depending on frequency of operation. As an alternative method of forming layer 13, diffusion of boron into the layer 12 may be employed.

Figure 3:
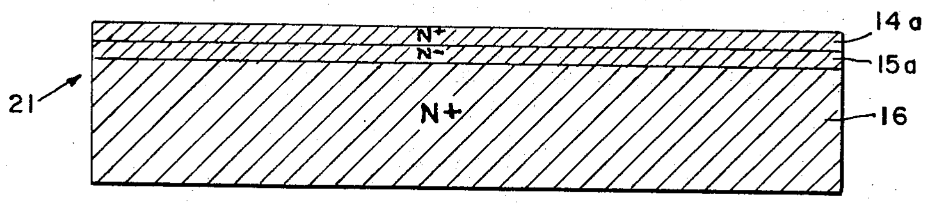

Referring now to FIG. 3 there is shown a second wafer 21. The characteristics of the wafer 21 are obtained by first forming the layer 16 which comprises a substrate of the wafer 21. The substrate layer 16 has a thickness of approximately 20 mils and may be made of silicon doped with antimony to form an $N^+$ type conductor. A silicon layer 15*a* doped with antimony of a thickness of about 1 mil is then epitaxially grown on layer 16 to form an $N^-$ type conductor. Following this a layer 14*a* comprising $N^+$ type silicon is formed by epitaxially growth on layer 15*a* to a depth of about 1 mil.

Figure 4:
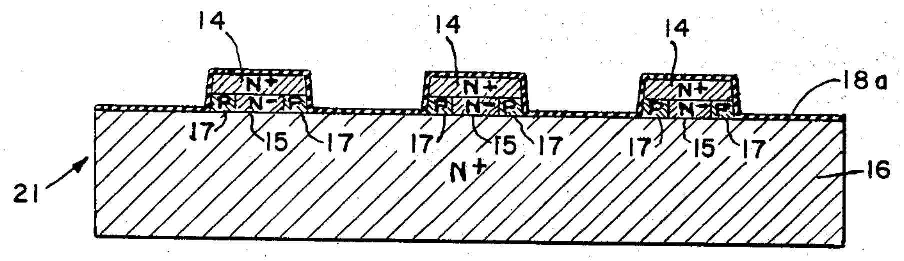

Referring now to FIG. 4 the wafer 21 has layers 14 and 15 formed having a diameter of approximately 4 mils by the anisotropic etching of grooves in layers 14*a* and 15*a* of FIG. 3. The top exposed surface of wafer 21 including the lateral surfaces of components 14 and 15 is then diffused with a small amount of boron so that only the lateral walls of the $N^-$ type conductor 15 surface to a depth of about 1 mil is converted to P type conductivity layer 17. The wafer 21 on its top surface is then completely covered with a silicon dioxide insulation layer 18*a* that is approximately 1–2 microns in depth.

Figure 5:
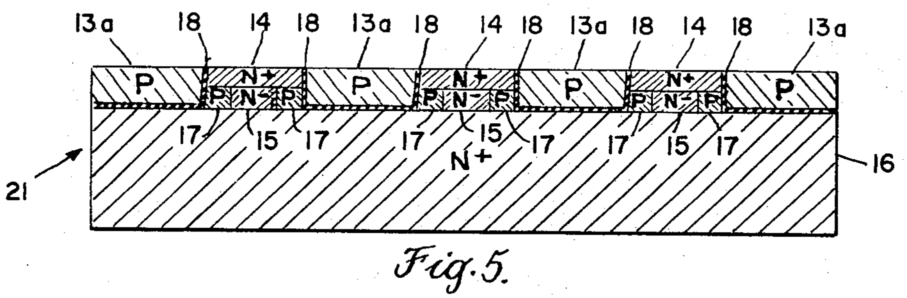

As shown in FIG. 5 the P type layer 13*a* is then epitaxially grown over the insulation layer thereby filling in the voids present. The uppermost surface remaining is then ground and polished removing excess P material and the insulation on top of layer 14 so that insulation layer 18 remains.

The second wafer 21 is then inverted and bonded to the first wafer 20 by a known laminating process of placing both wafers 21 and 22 in a vacuum chamber, heating the wafers to 1,300° C and pressing them together with 2,000 psi pressure for about 5 minutes.

A section is then removed by etching from layers 16, 18 and 13*a* to expose the shoulder 19 for biasing of the base of the multi-emitter transistor.

Figure 6:
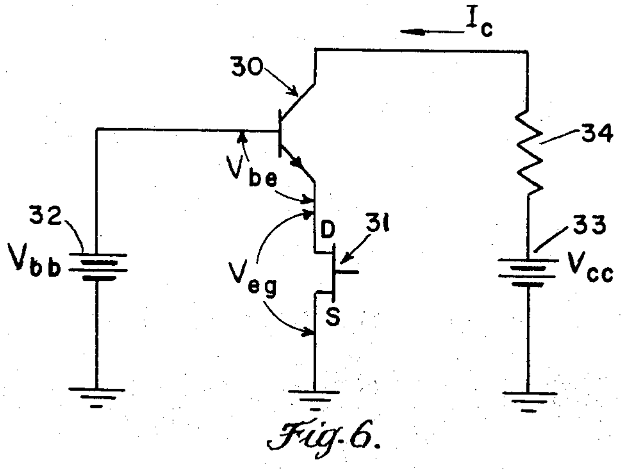
FIGS. 6 and 7 are schematic diagrams explaining the functional operation of the embodiment of FIG. 1.

The theory of operation of circuit 10 can be more clearly shown with reference to FIG. 6 wherein a bipolar transistor 30 is shown serially connected to an FET 31 so that a current $I_c$ flows through the collector and emitter electrodes of transistor 30 and the drain and source electrodes of FET 31. In the circuit as shown there are two fixed bias voltages, a $V_{bb}$ supply 32 connected between the base electrode of transistor 30 and ground and $V_{cc}$ supply 33 forming a series connection with a resistor 34 between the collector of transistor 30 and ground. In such a circuit the current $I_c$ is an exponential function of $V_{be}$, the base-emitter voltage of transistor 31. The voltage drop across FET is the voltage from the emitter contact to ground $V_{eg}$ since in FIG. 1 it can be seen that the emitter of transistor 30 and the drain of FET 31 are the same layer 15. Therefore, $$V_{be} = V_{bb} - V_{eg} \quad (1)$$

As $I_c$ increases, $V_{eg}$ increases causing a decrease in $V_{be}$ due to $V_{bb}$ remaining constant. Since the current $I_c$ is dependent on $V_{be}$ the current $I_c$ is therefore reduced. $V_{eg}$ has been found to increase nonlinearly with $I_c$, tending to limit the maximum current.

Figure 7:
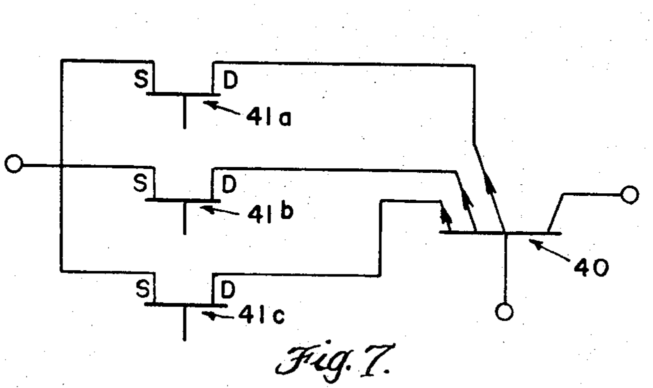

The actual schematic of circuit 10 is shown in FIG. 7 with a multi-emitter transistor 40 having its emitters serially connected to a plurality of FET's 41*a*, 41*b* and 41*c* having their source electrodes connected in common. The theory of operation for FIG. 6 can be applied to FIG. 7.

Figure 8:
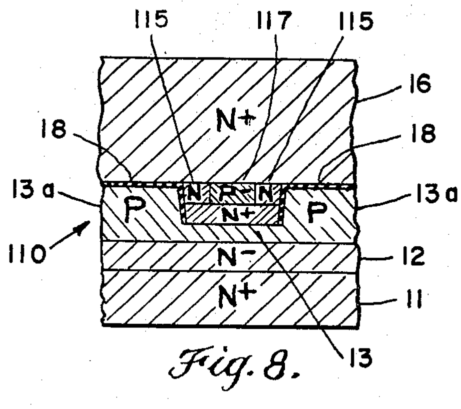
FIG. 8 is an alternate embodiment of a portion of FIG. 1.

FIG. 8 shows a portion of an alternate embodiment of a circuit 110 in which components identical to those of FIG. 1 carry the same numerals. A $P^-$ layer 117 is epitaxially grown in place of components 15 and 17 of FIG. 1. In operation an N type inversion channel 115 is formed at the perimeter of the $P^-$ layer 117 without any additional doping technique applied. This channel 115 formed upon the voltage biasing of the electrodes is the conducting channel of the device with layer 117 forming the gate. The inversion channel 115 is formed into layer 117 to a depth of about 1 mil.

It has therefore been shown an integrated circuit for providing the function of acting as a power transistor with current limiting ballast. The multi-emitters provide uniform current distribution throughout the device to enable the passage of more current than prior art devices of a similar size. Furthermore, the multicurrent paths being current limited prevent any hot spots from developing on the device.

It will be understood that various changes in the details, materials, steps and arrangements of parts, which have been herein described and illustrated in order to explain the nature of the invention, may be made by those skilled in the art within the principle and scope of the invention as expressed in the appended claims.

What is claimed is:

1. A current limiting device comprising:

a laminate having first, second and third layers, said first and third layers being of a first conductivity type and said second layer being of a second conductivity type and contiguous with said first layer; a plurality of first, second and third elements contiguous with each other interposed between said second and third layers, said first and second elements being contiguous with said thrid layer and one being of said second conductivity type, said second and third elements being interposed between said first element and said second layer, said third element being contiguous with said second layer and of said first conductivity type; an insulator contiguously interposed between said second layer and both said third layer and said second element;

whereby said first and second layers form collector and base electrodes, respectively, for a multi-emitter transistor, said third layer forms a common source electrode for each of a plurality of field effect transistors, said first and second elements form current channels and gates, respectively, of said field effect transistors, and said third elements commonly form drains of said field effect transistors and emitters of said multi-emitter transistor.

2. A current limiting device according to claim 1 wherein said insulator comprises silicon dioxide material.

3. A current limiting device according to claim 2 wherein:

said first conductivity type is N; and said second conductivity type is P.

4. A current limiting device according to claim 3 wherein said first element is of said first conductivity type.

* * * * *